(12) United States Patent
Sung et al.

(10) Patent No.: US 10,867,920 B2
(45) Date of Patent: Dec. 15, 2020

(54) ELECTRO-MIGRATION BARRIER FOR CU INTERCONNECT

(71) Applicant: Taiwan Semiconductor Manufacturing Co., Ltd., Hsin-Chu (TW)

(72) Inventors: Su-Jen Sung, Zhubei (TW); Chih-Chiang Chang, Zhubei (TW); Chia-Ho Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/227,062

(22) Filed: Dec. 20, 2018

(65) Prior Publication Data

US 2019/0148308 A1 May 16, 2019

Related U.S. Application Data (60) Division of application No. 15/343,393, filed on Nov. 4, 2016, now Pat. No. 10,163,795, which is a
(Continued)

(51) Int. Cl.
*H01L 23/532* (2006.01)
*H01L 21/768* (2006.01)

(52) U.S. Cl.
CPC .. *H01L 23/53238* (2013.01); *H01L 21/76832* (2013.01); *H01L 21/76834* (2013.01);
(Continued)

(58) Field of Classification Search
CPC ............. H01L 23/53238; H01L 23/532; H01L 23/5329
See application file for complete search history.

(56) References Cited

U.S. PATENT DOCUMENTS

| 4,970,574 | A |   | 11/1990 | Tsunenari |
|-----------|---|---|---------|-----------|
| 5,661,334 | A | * | 8/1997  | Akram ................ H01L 23/5222 257/632 |

(Continued)

FOREIGN PATENT DOCUMENTS

| JP | 5021378 B2 | 9/2012 |
|----|------------|--------|
| KR | 20100072321 A | 6/2010 |

OTHER PUBLICATIONS

Non-Final Office Action dated Dec. 10, 2014 for U.S. Appl. No. 13/967,596.
(Continued)

*Primary Examiner* — Peniel M Gumedzoe
(74) *Attorney, Agent, or Firm* — Eschweiler & Potashnik, LLC (57) ABSTRACT

The present disclosure, in some embodiments, relates to a method of forming an integrated circuit device. The method may be performed by forming a conductive line over a substrate and in contact with a liner. A dielectric barrier layer is formed on the conductive line. The dielectric barrier layer includes an interfacial layer contacting the conductive line, a middle layer contacting the interfacial layer, and an upper layer contacting the middle layer. The interfacial layer and the liner collectively completely surround the conductive line. An inter-level dielectric layer is formed along sidewalls of the upper layer.

20 Claims, 5 Drawing Sheets

Related U.S. Application Data continuation of application No. 13/967,596, filed on Aug. 15, 2013, now Pat. No. 9,490,209.

(60) Provisional application No. 61/778,674, filed on Mar. 13, 2013.

(52) U.S. Cl.
CPC .. *H01L 21/76849* (2013.01); *H01L 21/76852* (2013.01); *H01L 21/76885* (2013.01); *H01L 23/5329* (2013.01); *H01L 2924/0002* (2013.01)

(56) References Cited

U.S. PATENT DOCUMENTS

| | | | |
|---|---|---|---|
| 5,801,100 A * | 9/1998 | Lee | H01L 21/288 257/E21.022 |
| 6,020,263 A | 2/2000 | Shih et al. | |
| 6,020,273 A | 2/2000 | Cheng et al. | |
| 6,033,981 A | 3/2000 | Lee et al. | |
| 6,083,835 A | 7/2000 | Shue et al. | |
| 6,133,143 A | 10/2000 | Lin et al. | |
| 6,136,687 A | 10/2000 | Lee et al. | |
| 6,200,890 B1 | 3/2001 | Chen | |
| 6,461,225 B1 | 10/2002 | Misra et al. | |
| 6,475,901 B2 | 11/2002 | Nishimura et al. | |
| 6,566,250 B1 | 5/2003 | Tu et al. | |
| 6,645,859 B1 | 11/2003 | Sawada et al. | |
| 6,921,689 B2 * | 7/2005 | Matsuhashi | H01L 28/60 257/E21.011 |
| 2003/0008495 A1 | 1/2003 | Hsue et al. | |
| 2003/0183940 A1 | 10/2003 | Noguchi et al. | |
| 2005/0087871 A1 | 4/2005 | Abe | |
| 2005/0147762 A1 | 7/2005 | Dubin et al. | |
| 2006/0027922 A1 | 2/2006 | Lee et al. | |
| 2007/0057374 A1 * | 3/2007 | McLaughlin | H01L 21/31144 257/751 |
| 2007/0257369 A1 | 11/2007 | Huang | |
| 2008/0067679 A1 | 3/2008 | Takagi et al. | |
| 2008/0120580 A1 | 5/2008 | Hsu et al. | |
| 2009/0085145 A1 | 4/2009 | Feustel et al. | |
| 2010/0171220 A1 * | 7/2010 | Huang | H01L 21/76834 257/751 |
| 2011/0012238 A1 | 1/2011 | Cohen et al. | |
| 2012/0319279 A1 | 12/2012 | Isobayashi | |

OTHER PUBLICATIONS

Final Office Action dated Jun. 19, 2015 for U.S. Appl. No. 13/967,596.
Non-Final Office Action dated Oct. 5, 2015 for U.S. Appl. No. 13/967,596.
Final Office Action dated Apr. 21, 2016 for U.S. Appl. No. 13/967,596.
Notice of Allowance dated Jul. 6, 2016 for U.S. Appl. No. 13/967,596.
Non-Final Office Action dated Apr. 24, 2017 for U.S. Appl. No. 15/343,393.
Final Office Action dated Nov. 2, 2017 for U.S. Appl. No. 15/343,393.
Non-Final Office Action dated Mar. 7, 2018 for U.S. Appl. No. 15/343,393.
Notice of Allowance dated Aug. 24, 2018 for U.S. Appl. No. 15/343,393.

* cited by examiner

ELECTRO-MIGRATION BARRIER FOR CU INTERCONNECT

CROSS-REFERENCE TO RELATED APPLICATION

This Application is a Divisional of U.S. application Ser. No. 15/343,393, filed on Nov. 4, 2016, which is a Continuation of U.S. application Ser. No. 13/967,596, filed on Aug. 15, 2013 (now U.S. Pat. No. 9,490,209, issued on Nov. 8, 2016), which claims priority to U.S. Provisional Application No. 61/778,674, filed on Mar. 13, 2013. The contents of the above-referenced Patent Applications are hereby incorporated by reference in their entirety.

FIELD

The present disclosure relates to integrated circuit devices and methods for manufacturing them.

BACKGROUND

Many years of research have been devoted to reducing the critical dimensions (CDs) and structure densities of integrated circuits (ICs). As densities have increased, the resistance capacitance (RC) delay time has become a limiting factor in circuit performance. RC delay can be reduced by using copper in place of aluminum for metal interconnect structures. RC delay can also be reduced by using low-k or extremely low-k dielectrics.

Electro-migration can cause copper to diffuse into adjacent structures and create voids within copper lines. Electro-migration is typically mitigated using diffusion barriers. Diffusion barriers are generally provided between copper and adjacent structures. A variety of diffusion barrier materials have been used. Examples of conductive barrier materials include compounds of transition metals such as tantalum nitride, titanium nitride, and tungsten nitride. Examples of dielectric diffusion barrier materials include silicon nitride, silicon oxynitride, and silicon carbide.

DETAILED DESCRIPTION

The present disclosure provides integrated circuit devices and methods of forming them. The devices include a dielectric barrier layer formed over a copper-containing metal interconnect structure. The dielectric barrier layer inhibits electro-migration of Cu. The dielectric barrier layer includes a metal-containing layer that forms an interface with the copper-containing metal of the interconnect structure. Incorporating metal within the interfacial layer improves adhesion of the dielectric barrier layer to copper lines and the like and provides superior electro-migration resistance over the operating lifetime of the devices.

Figure 1:
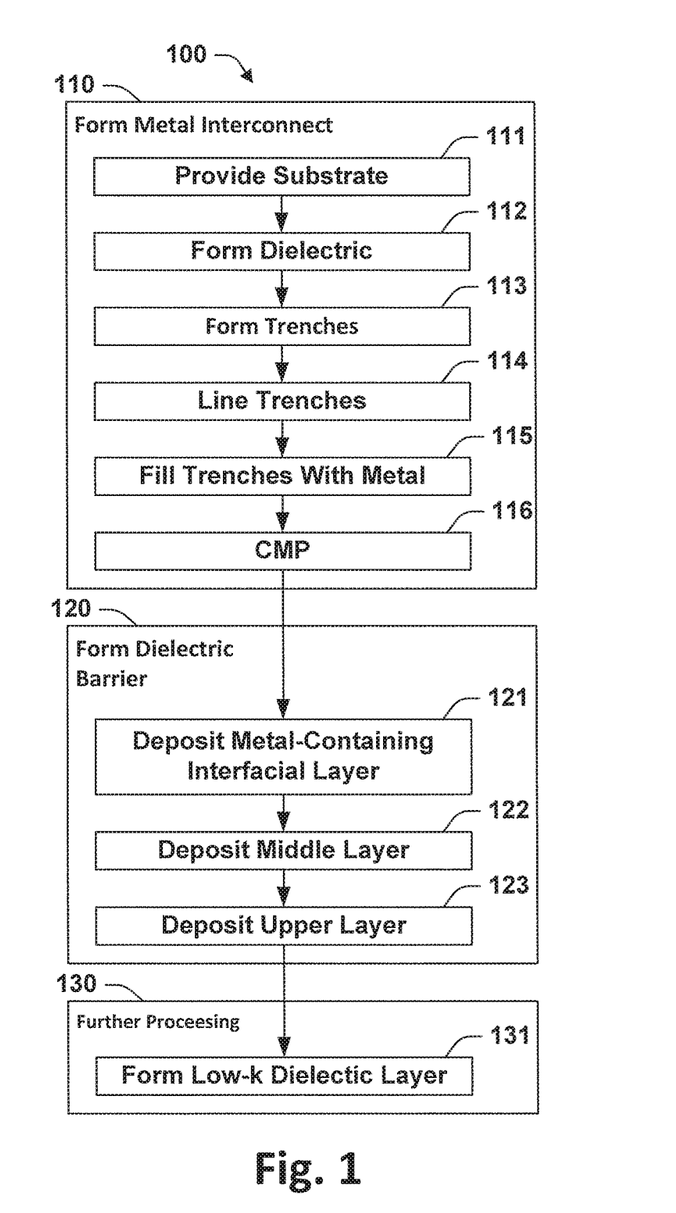
FIG. 1 is a flow chart of an example process according to an embodiment of the present disclosure.

FIG. 1 is a flow chart of an example process 100 according to an embodiment of the present disclosure. The process 100 begins with a series of actions 110 that form a metal interconnect with exposed copper-containing metal. The next series of actions 120 form a dielectric barrier layer over the exposed copper. Additional processing 130 can follow, and typically includes forming structures such as additional metal interconnect layers over the dielectric barrier layer.

Figure 2:
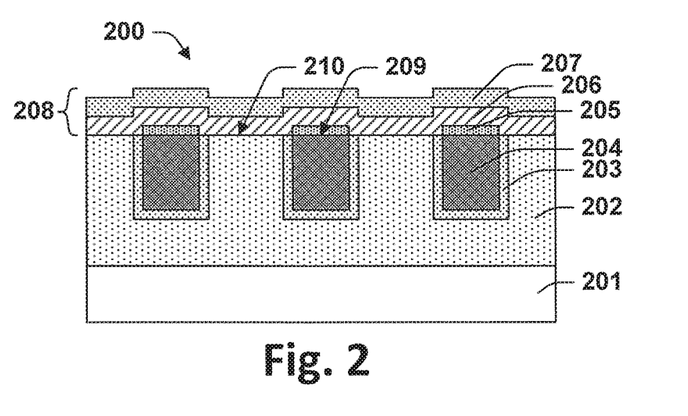
FIG. 2 is a schematic illustration of a semiconductor device according to an embodiment of the present disclosure.

FIG. 2 is a schematic illustration of an integrated circuit device 200, which is an embodiment of the present disclosure and an example of the type of device that can be produced by the process 100. The device 200 includes metal lines 204 formed within a matrix of dielectric 202. The dielectric 202 is formed over a substrate 201. Trench liner 203 provides a barrier between the conductive lines 204 and the dielectric 202. A dielectric barrier layer 208 is formed over the conductive lines 204. The dielectric barrier layer 208 includes a metal-containing interfacial layer 205, a middle layer 206, and an upper layer 207. In some embodiments, the middle layer 206 is not required and is excluded. In some embodiments, neither the middle layer 206 or the upper layer 207 is required, and both are excluded.

Figure 3:
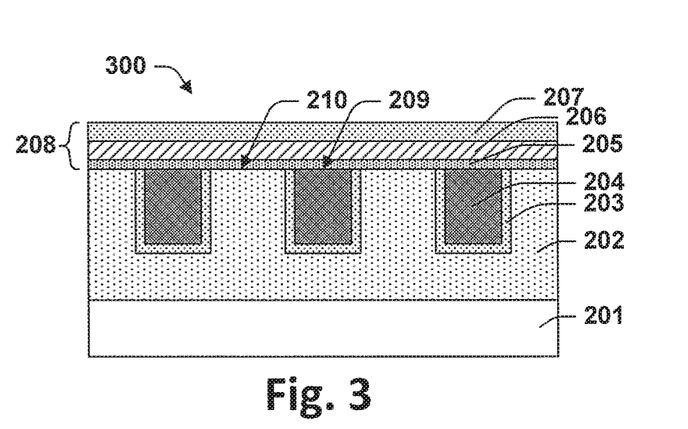
FIG. 3 is a schematic illustration of a semiconductor device according to another embodiment of the present disclosure.

In the device 200, the interfacial layer 205 has been formed by a selective deposition process, whereby the interfacial layer 205 is formed above the upper surface 209 of metal lines 204 but not above the upper surface 210 of dielectric 202. In some embodiments, the interfacial layer 205 is formed by a non-selective deposition process, whereby the interfacial layer 205 is formed above both the upper surface 209 of metal lines 204 and the upper surface 210 of dielectric 202. FIG. 3 is a schematic illustration of a integrated circuit device 300, which is an example of such embodiments.

Figure 4:
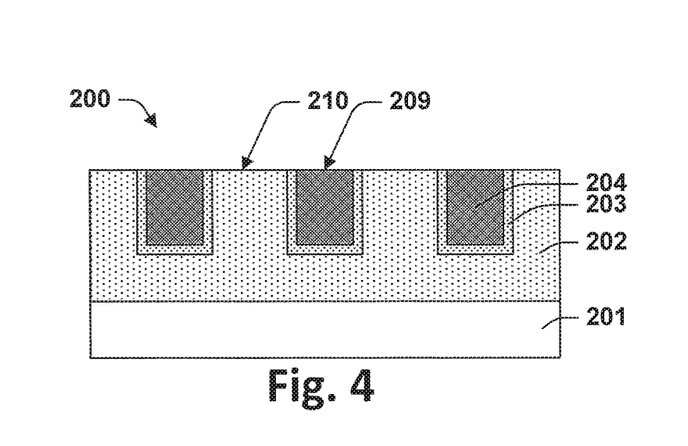
FIG. 4 is a schematic illustration of a semiconductor device including the interconnect structure used in the embodiments of FIGS. 2 and 3.

The metal interconnect can be formed by any suitable process. Suitable processes for forming the metal interconnect include, without limitation, damascene and dual damascene processes. The copper-containing metal 204 may be exposed at an intermediate stage of the damascene or dual damascene process. In the example process 100 illustrated by FIG. 1, the actions 110 that form a metal interconnect with exposed copper-containing metal 204 include: action 111, providing the substrate 201; action 112, forming a layer of dielectric 202 over the substrate 201; action 113, forming trenches within the dielectric 202; action 114, lining the trenches with trench liner 203; action 115, filling the trenches with copper-containing metal 204 to form metal lines; and action 116, planarization such as chemical mechanical polishing 116. FIG. 4 provides an example of the device 200 at this stage of manufacture.

Figure 5:
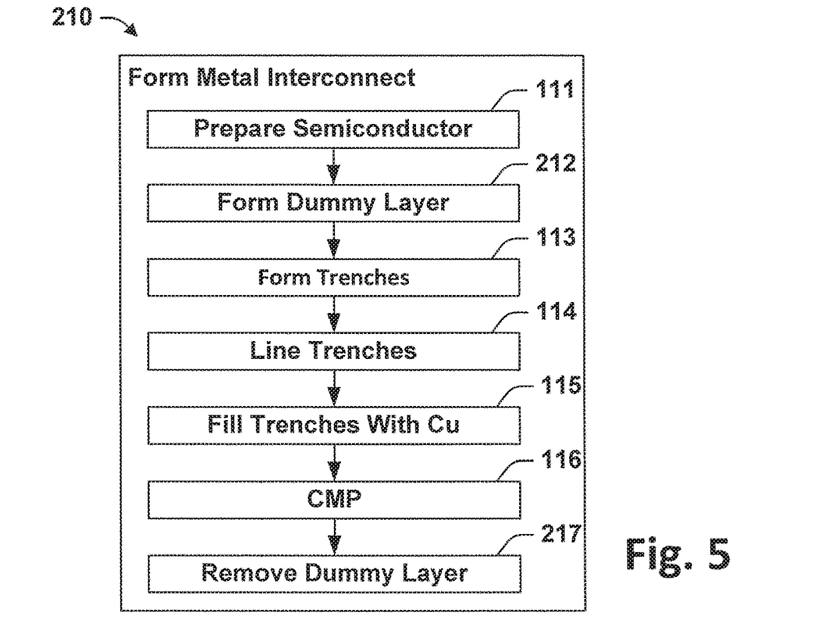
FIG. 5 is a flow chart of an alternate process as used in some other embodiments to form a metal interconnect structure.
Figure 6:
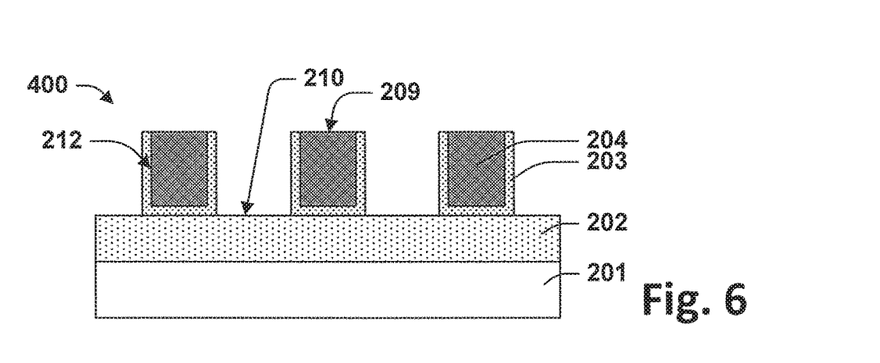
FIG. 6 is a schematic illustration of a semiconductor device including an example interconnect structure formed by the process of FIG. 5.
Figure 7:
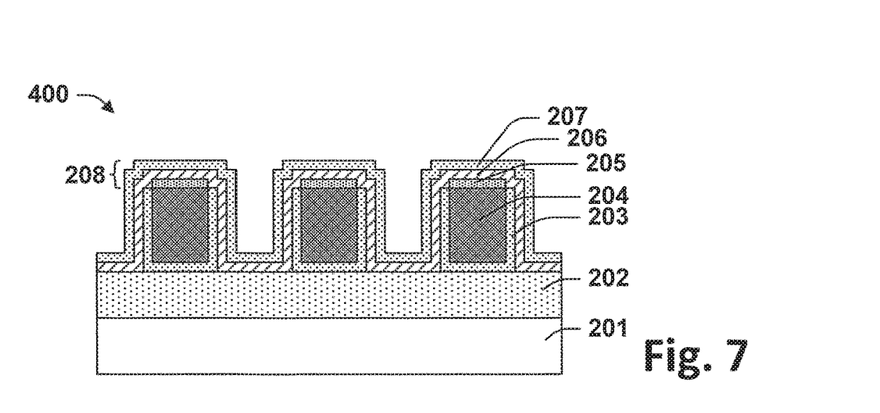
FIG. 7 is a schematic illustration of a semiconductor device according to some embodiments that use the interconnect structure of FIG. 6.
Figure 8:
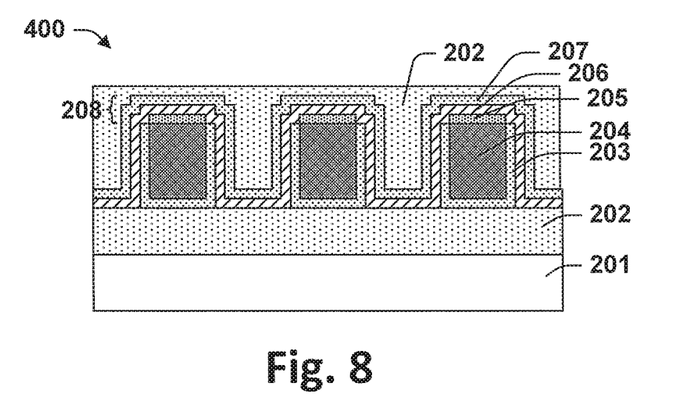
FIG. 8 is a schematic illustration of the semiconductor device of FIG. 7 after further processing.

FIG. 5 provides a flow chart for a process 210, which is another process that can be used for forming the metal interconnect. The process 210 is similar to the process 110 except for action 212, which forms a dummy layer that temporarily takes the place of all or part of the matrix of dielectric 202 within which conductive lines 204 are inlaid. The dummy layer is later removed with action 217. FIG. 6 provides a schematic illustration of a device 400 at the conclusion of process 210. FIG. 7 provides a schematic illustration of the device 400 after applying the process 120 to form the dielectric barrier layer 208. If the dielectric barrier layer 208 includes the upper layer 207 as illustrated in FIG. 7, the dielectric barrier layer 208 for the device 400 forms to the sides 212 as well as above the upper surface 209 of the conductive lines 204. As illustrated by FIG. 8, after further processing 130, the dielectric 202 forms a matrix within which conductive lines 204 are inlaid.

The process 210 of FIG. 5 is illustrative of embodiments in which metal lines 204 are formed before the surrounding matrix of dielectric 202. An advantage of forming the metal lines 204 first is avoiding damage or contamination of the surrounding dielectric 202 during processing that forms the metal lines 204. This can be particularly useful when the dielectric 202 includes an extremely low-k dielectric. Extremely low-k dielectrics are particularly susceptible to such damage or contamination.

Figure 9:
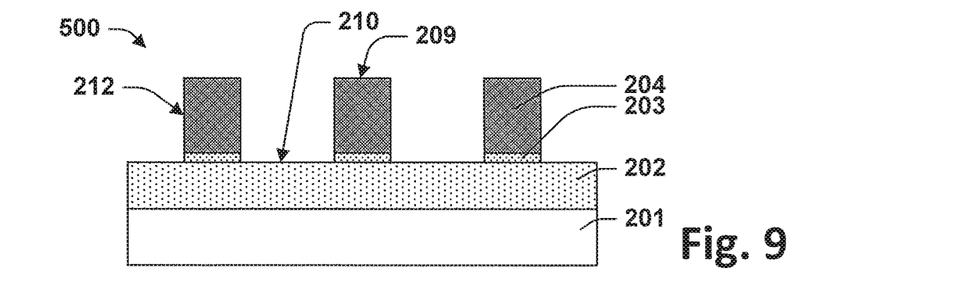
FIG. 9 is a schematic illustration of a semiconductor device including another example interconnect structure.
Figure 10:
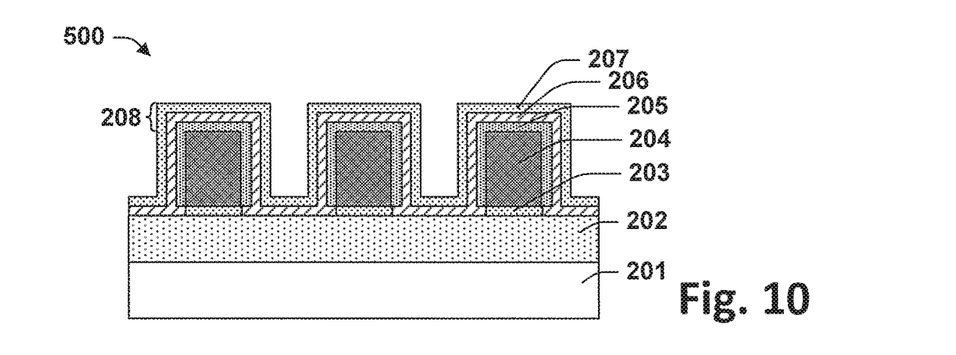
FIG. 10 is a schematic illustration of a semiconductor device according to some embodiments that use the interconnect structure of FIG. 9.
Figure 11:
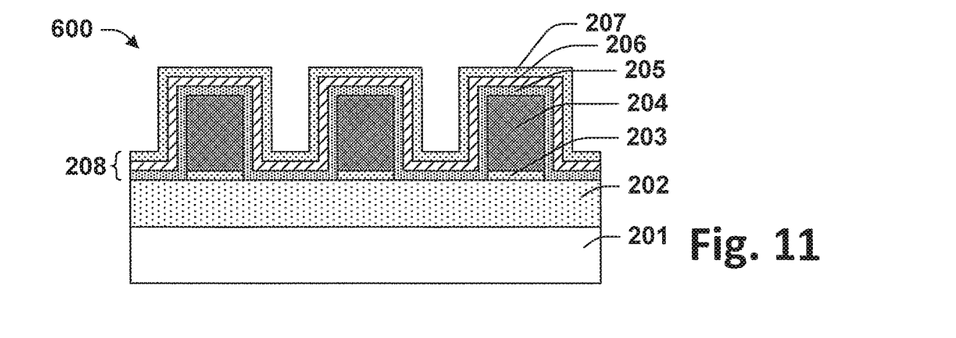
FIG. 11 is a schematic illustration of a semiconductor device according to some other embodiments that use the interconnect structure of FIG. 9.

Some embodiments employ a variation of process 210 in which lining the trenches, action 114, is skipped. FIG. 9 is a schematic illustration of a device 500 that provides an example of the resulting metal interconnect structure formed by this modified process 210. FIG. 10 provides an example of the resulting structure after applying the actions 120 that form the dielectric barrier layer 208 to the device 500 as illustrated in FIG. 9. The device 500 of FIG. 10 illustrates the case in which the interfacial layer 205 is formed by a selective deposition process 121. The device 600 illustrated by FIG. 11 illustrates the case in which the interfacial layer 205 is formed by a non-selective deposition process 121. In either case, the interfacial layer 205 forms to the sides 212 as well as on the upper surface 209 of the conductive lines 204. This can be advantageous when the dielectric barrier layer 208 provides superior resistance to electro-migration as compared to the trench liner 203.

The process 120 of forming the dielectric barrier layer 208 in FIG. 1 begins with action 121, forming the interfacial layer 205. In some embodiments, action 121 is a selective deposition process. In other embodiments, action 121 is a non-selective deposition process. In the present context, selective or non-selective is in relation to the exposed surfaces of copper-containing metal 204. Although the interfacial layer 205 contains metal, the interfacial layer 205 can be a dielectric. When the interfacial layer 205 is deposited by a non-conformal deposition process, a dielectric quality for the interfacial layer 205 is desirable to prevent bridging between conductive lines 204.

The composition of the interfacial layer 205 is selected to provide good adhesion to copper-containing metal lines 204 and stable protection against electro-migration. These properties can be provided by a composition having the formula $M_xO_yN_z$ where M is a metal, O is oxygen, and N is nitrogen. Generally, the metal is selected from the group consisting of Al, Mn, Co, Ti, Ta, W, Ni, Sn, Mg, and combinations thereof. In some embodiments, the interfacial layer 205 is a dielectric, x is in the range from 20 to 70%, y is in the range from 0-80%, z is in the range from 0-80%, and the sum of y and z is at least 30%. In some embodiments in which the interfacial layer 205 is deposited conformally, x is in the range from 40-100%, y is in the range from 0-60%, and z is in the range from 0-60%. Specific examples for the composition of the interfacial layer 205 include Co and AlN.

The thickness of the interfacial layer 205 can be in the range from 5 Å to 100 Å. In embodiments where the dielectric barrier layer 208 does not include the upper layer 207, the thickness is typically in the range from 20 Å to 100 Å. In embodiments where the dielectric barrier layer 208 includes the upper layer 207, the thickness is typically in the range from 5 Å to 50 Å.

The interfacial layer 205 can be formed by any suitable process. Examples of suitable processes for selective deposition of the interfacial layer 205 include, without limitation, electroplating and electroless plating. Examples of suitable processes for non-conformal deposition of the interfacial layer 205 include, without limitation, physical vapor deposition (PVD), chemical vapor deposition (CVD), and sputtering. As a specific example, the interfacial layer 205 can be formed by plasma-enhanced chemical vapor deposition (PECVD).

The process 120 of forming the dielectric barrier layer 208 continues with action 122, forming the middle layer 206. In some embodiments, the middle layer 206 is excluded. In other embodiments, the middle layer 206 is included within the dielectric barrier layer 208 to improve overall performance of the dielectric barrier layer 208 in preventing electro-migration.

The middle layer 206 is a dielectric having a composition selected to provide an effective barrier to the diffusion of copper. Suitable compositions for the middle layer 206 include, for example, SiN, SiC, SiCO and SiCN. The thickness of the middle layer 206 is typically in the range from 10 Å to 200 Å.

The middle layer 206 can be formed by any suitable process. Examples of processes that can be suitable for forming the middle layer 206 include, without limitation, physical vapor deposition (PVD), chemical vapor deposition (CVD), and sputtering. As a specific example, the middle layer 206 can be formed by plasma-enhanced chemical vapor deposition (PECVD).

The process 120 of forming the dielectric barrier layer 208 continues with action 123, forming the upper layer 207. In some embodiments, both the middle layer 206 and the upper layer 207 are excluded. In embodiments that include the middle layer 206, the upper layer 207 is generally superior to the middle layer 206 in terms of suitability for functioning as an etch stop layer. In embodiments that do not include the middle layer 206, and in some other embodiments as well, the upper layer 207 is included within the dielectric barrier layer 208 to improve overall performance of the dielectric barrier layer 208 in preventing electro-migration.

The upper layer 207 is a dielectric. The composition of the upper layer 207 can be selected to provide an effective barrier to the diffusion of copper. The composition of the upper layer 207 can also be selected to provide an etch stop layer for use during further process 130. Suitable compositions for the upper layer 207 include, for example, SiN, SiC, SiCN, SiON, and SiCON. The thickness of the upper layer 207 is typically in the range from 50 Å to 500 Å. As a specific example, the upper layer 207 can be SiCN while the middle layer 206 is SiN.

The upper layer 207 can be formed by any suitable process. Examples of processes that can be suitable for forming the upper layer 207 include, without limitation, physical vapor deposition (PVD), chemical vapor deposition (CVD), and sputtering. As a specific example, the upper layer 207 can be formed by plasma-enhanced chemical vapor deposition (PECVD).

The process 100 continues with further process 130. Further processing can include any steps necessary to complete formation of the device 100. In some embodiments, further processing includes at least action 161, forming a low-k dielectric layer over the dielectric barrier layer 208. This can be the low-k dielectric layer 203 that forms a matrix within which the conductive lines 204 are inlaid or the dielectric matrix for another overlying metal interconnect layer. The dielectric barrier layer 208 can be functional to mitigate electro-migration of copper from conductive lines 204 into the overlying low-k dielectric.

Copper-containing metal 204 can be copper or a conductive copper alloy. In some embodiments, metal 204 is copper as that term is used for copper interconnects in the semiconductor industry. In that context, copper is a metal formed primarily of copper atoms, but can be copper that is alloyed, doped, or otherwise impure.

The substrate 201 can be any suitable substrate. In most embodiments, the substrate 201 includes a semiconductor. Examples of semiconductors include, without limitation, silicon, silicon on insulator (SOI), Ge, SiC, GaAs, GaAlAs, InP, GaN SiGe. In some embodiments, the substrate 201 includes device formed during front-end-of-line processing. Device structures that can be formed during FEOL processing include, without limitation, memory devices, logical devices, FETs and components thereof such as source regions, drain regions, and gate electrodes, active devices, passive devices, and combinations thereof. The substrate 201 can also include insulators, conductors, and interconnect structures, including structures formed during back-end of line (BEOL) processing.

The dielectric 203 can include one or more layers of low-k dielectrics. A low-k dielectric is a material having a dielectric constant lower than that of silicon dioxide. Examples of low-k dielectrics include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclbbutene, and amorphous polytetrafluoroethylene (PTFE). A low-k dielectric can be applied by any suitable means, including for example, spin coating or CVD.

An extremely low-k dielectric is a material having a dielectric constant of about 2.1 or less. An extremely low-k dielectric can be formed by deposition of a low-k dielectric in such a manner that it has porosity or air-gaps, whereby the effective dielectric constant of the composite including pores and air gaps is 2.1 or less.

The present disclosure describes an integrated circuit device including a substrate, a copper-containing conductive line formed above the substrate, and a dielectric barrier layer above and in contact with the copper-containing conductive line. The dielectric barrier layer includes an interfacial layer that forms the interface between the dielectric barrier layer and the copper-containing conductive line. The interfacial layer has an atomic fraction of metal that is at least 20%.

The present disclosure describes a method of forming an integrated circuit device. The method includes forming a copper-containing conductive line over a substrate and forming a dielectric barrier layer over the copper-containing conductive line. The dielectric barrier layer includes at least a lower layer that is in contact with the copper-containing conductive line. The dielectric barrier layer includes an interfacial layer that forms an interface between the dielectric barrier layer and the copper-containing conductive line. The interfacial layer has an atomic fraction of metal that is at least 20%.

In some embodiments, the present disclosure relates to an integrated circuit device. The integrated circuit device comprises a substrate, and a conductive metal interconnect line arranged within a dielectric material disposed over the substrate. An interfacial layer is in contact with an upper surface of the conductive metal interconnect line. An upper dielectric layer is arranged over the interfacial layer. A middle dielectric layer is arranged between the upper dielectric layer and the interfacial layer.

In other embodiments, the present disclosure relates to an integrated circuit device. The integrated circuit device comprises a conductive metal interconnect line arranged within an inter-level dielectric material. An interfacial layer extends over an upper surface of the conductive metal interconnect line, and a liner is arranged along one or more surfaces of the conductive metal interconnect line not contacting the interfacial layer. A second dielectric layer overlies the interfacial layer and the liner. A second inter-level dielectric material laterally surrounds the second dielectric layer.

In yet other embodiments, the present disclosure relates to an integrated circuit device. The integrated circuit device comprises a substrate, and a conductive metal interconnect line arranged within a dielectric material disposed over the substrate. An interfacial layer is in contact with an upper surface of the conductive metal interconnect line. The interfacial layer has a planar lower surface contacting the conductive metal interconnect line. A liner is arranged along one or more surfaces of the conductive metal interconnect line not contacting the interfacial layer.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. A method of forming an integrated circuit device, comprising:
   forming a conductive line over a substrate and in contact with a liner;
   forming a dielectric barrier layer on the conductive line, the dielectric barrier layer including:
      an interfacial layer contacting the conductive line, wherein the interfacial layer and the liner collectively completely surround the conductive line;
      a middle layer contacting the interfacial layer; and
      an upper layer contacting the middle layer; and
   forming an inter-level dielectric layer along sidewalls of the upper layer.

2. The method of claim 1, wherein the conductive line and the liner are formed over a lower dielectric layer, the middle layer contacting the lower dielectric layer.

3. The method of claim 1, wherein the interfacial layer has a bottommost surface that is over a topmost surface of the liner.

4. The method of claim 1, wherein the middle layer has a bottommost surface that is over a topmost surface of the liner.

5. The method of claim 1, wherein the middle layer contacts the liner.

6. The method of claim 1, wherein a horizontal plane that is parallel to an upper surface of the conductive line extends through sidewalls of the conductive line, the interfacial layer, and the middle layer.

7. The method of claim 1, wherein the middle layer vertically extends from a bottom of the interfacial layer to over the interfacial layer.

8. A method of forming an integrated circuit device, comprising:
   forming a conductive interconnect over a lower dielectric layer;
   forming an interfacial layer directly contacting a top of the conductive interconnect, wherein together the interfacial layer and a liner completely surround the conductive interconnect as viewed in a cross-sectional view of the conductive interconnect;
   forming a first dielectric layer over the conductive interconnect and directly contacting a top of the interfacial layer, wherein the first dielectric layer has a bottommost surface that is above a bottommost surface of the liner; and
   wherein the interfacial layer comprises an atomic fraction of metal that is at least about 20% and a combined atomic fraction of nitrogen and oxygen of at least about 30%.

9. The method of claim 8, wherein the first dielectric layer directly contacts sidewalls of the interfacial layer, the top of the interfacial layer, and a topmost surface of the liner.

10. The method of claim 8, further comprising:
    forming a second dielectric layer having a bottommost surface contacting the first dielectric layer above the top of the conductive interconnect, wherein the second dielectric layer comprises silicon and carbon or nitrogen.

11. The method of claim 8, further comprising:
    forming a second dielectric layer contacting the first dielectric layer; and
    forming an inter-level dielectric layer over and along sidewalls of the second dielectric layer, wherein the second dielectric layer separates a sidewall of the first dielectric layer from a sidewall of the inter-level dielectric layer along a horizontal plane that is parallel to the top of the interfacial layer.

12. The method of claim 8, further comprising:
    forming a second dielectric layer contacting the first dielectric layer along opposing sides of the conductive interconnect, wherein the first dielectric layer completely separates the second dielectric layer from the interfacial layer.

13. The method of claim 8, wherein the first dielectric layer contacts the interfacial layer along an interface that continuously extends from directly above the conductive interconnect to directly above a second conductive interconnect.

14. The method of claim 8, wherein the liner is arranged along a lower surface and sidewalls of the conductive interconnect.

15. A method of forming an integrated circuit device, comprising:
    forming a conductive interconnect over a lower dielectric layer;
    forming an interfacial layer directly contacting a top of the conductive interconnect, wherein together the interfacial layer and a liner completely surround the conductive interconnect as viewed in a cross-sectional view of the conductive interconnect;
    forming a first dielectric layer over the conductive interconnect and directly contacting a top of the interfacial layer, wherein the first dielectric layer has a bottommost surface that is above a bottommost surface of the liner; and
    forming a second dielectric layer contacting the first dielectric layer along opposing sides of the conductive interconnect, wherein the first dielectric layer completely separates the second dielectric layer from the interfacial layer.

16. The method of claim 15, wherein the interfacial layer contacts the lower dielectric layer along an interface that is vertically at the top of the conductive interconnect.

17. The method of claim 15, wherein the interfacial layer directly contacts sidewalls of the conductive interconnect.

18. The method of claim 15, further comprising:
    forming a second conductive interconnect over the lower dielectric layer, wherein the first dielectric layer continuously extends from directly over the conductive interconnect to directly over the second conductive interconnect.

19. The method of claim 15, wherein the bottommost surface of the first dielectric layer is completely above the top of the conductive interconnect.

20. The method of claim 15, wherein the first dielectric layer is conformal to the interfacial layer.

* * * * *